(12) United States Patent
Cheng et al.

(10) Patent No.: US 10,109,709 B2
(45) Date of Patent: Oct. 23, 2018

(54) P-FET WITH STRAINED SILICON-GERMANIUM CHANNEL

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/829,797

(22) Filed: Aug. 19, 2015

(65) Prior Publication Data

US 2015/0357411 A1    Dec. 10, 2015

Related U.S. Application Data

(62) Division of application No. 14/219,067, filed on Mar. 19, 2014.

(51) Int. Cl.
*H01L 29/06* (2006.01)
*H01L 29/10* (2006.01)
(Continued)

(52) U.S. Cl.
CPC .. *H01L 29/0669* (2013.01); *H01L 21/823807* (2013.01); *H01L 21/823821* (2013.01);
(Continued)

(58) Field of Classification Search
CPC ............. H01L 29/0669; H01L 29/1079; H01L 29/161; H01L 29/785; H01L 27/1211;
(Continued)

(56) References Cited

U.S. PATENT DOCUMENTS 6,461,945 B1    10/2002  Yu
6,600,170 B1 *   7/2003  Xiang ............. H01L 21/823807
                                                    257/18
(Continued)

FOREIGN PATENT DOCUMENTS

EP    2149150 A1    2/2010
EP    2302668 A2    3/2011
EP    2389684 A2    11/2011

OTHER PUBLICATIONS

Pending U.S. Appl. No. 14/219,067, filed Mar. 19, 2014, entitled: "P-FET With Strained Silicon-Germanium Channel", pp. 1-29.
(Continued)

*Primary Examiner* — Mary Wilczewski
(74) *Attorney, Agent, or Firm* — Michael A. Petrocelli (57) ABSTRACT

A method of forming a semiconductor structure includes forming a dummy gate above a semiconductor substrate. The dummy gate defines a source-drain region adjacent to the dummy gate and a channel region below the dummy gate. A silicon-germanium layer is epitaxially grown above the source-drain region with a target concentration of germanium atoms. The semiconductor structure is annealed to diffuse the germanium atoms from the silicon-germanium layer into the channel region to form a silicon-germanium channel region.

16 Claims, 8 Drawing Sheets

(51) Int. Cl.
*H01L 29/161* (2006.01)
*H01L 29/78* (2006.01)
*H01L 27/12* (2006.01)
*H01L 27/092* (2006.01)
*H01L 21/8238* (2006.01)
*H01L 29/66* (2006.01)
*H01L 21/84* (2006.01)
*H01L 29/423* (2006.01)
*H01L 29/786* (2006.01)
*H01L 21/8234* (2006.01)

(52) U.S. Cl.
CPC ............ *H01L 21/84* (2013.01); *H01L 21/845* (2013.01); *H01L 27/092* (2013.01); *H01L 27/0924* (2013.01); *H01L 27/1203* (2013.01); *H01L 27/1211* (2013.01); *H01L 29/0676* (2013.01); *H01L 29/1079* (2013.01); *H01L 29/161* (2013.01); *H01L 29/42392* (2013.01); *H01L 29/66545* (2013.01); *H01L 29/785* (2013.01); *H01L 29/78696* (2013.01); *H01L 21/823431* (2013.01)

(58) Field of Classification Search
CPC ............ H01L 29/66545; H01L 21/84; H01L 21/823807; H01L 27/1203; H01L 27/092; H01L 29/6695; H01L 29/78696; H01L 29/0676; H01L 27/0924; H01L 21/823431; H01L 21/823821
USPC .................................................. 438/482, 300
See application file for complete search history.

(56) References Cited

U.S. PATENT DOCUMENTS

| | | | |
|---|---|---|---|
| 6,620,664 B2 | 9/2003 | Ma et al. | |
| 7,018,901 B1 | 3/2006 | Thean et al. | |
| 7,456,087 B2* | 11/2008 | Cheng ................... | H01L 29/165 257/E21.001 |
| 8,169,024 B2* | 5/2012 | Cheng ............... | H01L 29/66795 257/300 |
| 8,384,167 B2 | 2/2013 | Kikuchi et al. | |
| 8,497,528 B2* | 7/2013 | Lee ................... | H01L 29/66795 257/18 |
| 8,546,203 B1* | 10/2013 | Cheng .................... | H01L 21/84 257/347 |
| 8,623,728 B2 | 1/2014 | Chang et al. | |
| 8,703,578 B2* | 4/2014 | Hoentschel ........... | H01L 27/092 257/E21.618 |
| 9,147,594 B2* | 9/2015 | Lee ................... | H01L 29/66795 |
| 9,564,529 B2* | 2/2017 | Lee ................... | H01L 29/66795 |
| 9,590,037 B2 | 3/2017 | Cheng et al. | |
| 9,660,082 B2 | 5/2017 | Chang et al. | |
| 2005/0112857 A1 | 5/2005 | Gluschenkov et al. | |
| 2005/0266645 A1* | 12/2005 | Park ................... | H01L 29/1033 438/282 |
| 2005/0287752 A1 | 12/2005 | Nouri et al. | |
| 2006/0292762 A1 | 12/2006 | Borland et al. | |
| 2007/0096148 A1* | 5/2007 | Hoentschel ............. | H01L 21/84 257/192 |
| 2007/0267703 A1* | 11/2007 | Chong .............. | H01L 29/66628 257/368 |
| 2007/0275513 A1 | 11/2007 | Coronel et al. | |
| 2007/0287259 A1 | 12/2007 | Kavalieros et al. | |
| 2008/0128746 A1* | 6/2008 | Wang ................... | H01L 29/7848 257/190 |
| 2008/0157119 A1* | 7/2008 | Tsai ...................... | H01L 29/165 257/190 |
| 2008/0185612 A1* | 8/2008 | Fukuda ............. | H01L 21/02381 257/190 |
| 2008/0217686 A1* | 9/2008 | Majumdar .......... | H01L 29/7848 257/347 |
| 2009/0039426 A1* | 2/2009 | Cartier .............. | H01L 21/28079 257/344 |
| 2009/0075029 A1* | 3/2009 | Thomas ............ | H01L 21/02381 428/173 |
| 2009/0146181 A1 | 6/2009 | Lai et al. | |
| 2010/0193882 A1* | 8/2010 | Hoentschel ........... | H01L 29/165 257/410 |
| 2011/0049630 A1* | 3/2011 | Majumdar ...... | H01L 21/823807 257/351 |
| 2011/0108920 A1* | 5/2011 | Basker .................. | H01L 21/845 257/351 |
| 2011/0169141 A1* | 7/2011 | Shepard, Jr. ...... | H01L 21/02164 257/640 |
| 2011/0254090 A1* | 10/2011 | Cheng ............... | H01L 29/66772 257/347 |
| 2012/0049284 A1* | 3/2012 | Doris .................. | H01L 27/1211 257/350 |
| 2012/0061759 A1* | 3/2012 | Cheng ............... | H01L 29/66628 257/347 |
| 2012/0139007 A1 | 6/2012 | Tatsumura et al. | |
| 2012/0193729 A1 | 8/2012 | Ando et al. | |
| 2012/0238066 A1 | 9/2012 | Jeong et al. | |
| 2012/0276695 A1 | 11/2012 | Cheng et al. | |
| 2012/0313168 A1* | 12/2012 | Cheng ............... | H01L 29/66772 257/347 |
| 2013/0015525 A1* | 1/2013 | Cheng ................ | H01L 21/0217 257/351 |
| 2013/0193514 A1* | 8/2013 | Loubet .................... | H01L 21/84 257/347 |
| 2014/0175543 A1 | 6/2014 | Glass et al. | |
| 2014/0363964 A1* | 12/2014 | Breil ................. | H01L 29/42372 438/595 |
| 2015/0357411 A1* | 12/2015 | Cheng ................... | H01L 29/161 257/9 |
| 2017/0092765 A1* | 3/2017 | Doris .................. | H01L 29/7851 |
| 2017/0125303 A1* | 5/2017 | Cheng .............. | H01L 21/82381 |

OTHER PUBLICATIONS

Pending U.S. Appl. No. 15/402,265, filed Jan. 10, 2017, entitled; "P-FET With Strained Silicon-Germanium Channel", 30 pages.

* cited by examiner

P-FET WITH STRAINED SILICON-GERMANIUM CHANNEL

CROSS-REFERENCE TO RELATED APPLICATIONS

The present application is a divisional of and claims the benefit of priority of U.S. patent application Ser. No. 14/219,067, filed on Mar. 19, 2014 with the U.S. Patent and Trademark Office (USPTO), the contents of which are herein incorporated by reference in its entirety.

BACKGROUND

The present invention generally relates to semiconductor structures, and more particularly to p-type field effect transistor (p-FET) devices having a strained silicon-germanium (SiGe) channel, and a method for making the same.

Complementary Metal-oxide-semiconductor (CMOS) technology is commonly used for fabricating field effect transistors (FETs) as part of advanced integrated circuits (IC), such as CPUs, memory, storage devices, and the like. At the core of FETs, a channel region is formed in an n-doped or p-doped semiconductor substrate on which a gate structure is formed. Depending whether the on-state current is carried by electrons or holes, the FET comes as an n-FET device or a p-FET device. The overall fabrication process may include forming a gate structure over a channel region connecting source-drain regions within the substrate on opposite sides of the gate, typically with some vertical overlap between the gate and the source-drain region.

An option for continued scaling of planar FETs to the 22 nm node and beyond may be building these devices on an extremely thin semiconductor-on-insulator (ETSOI) substrate. However, fin field effect transistors (FinFETs) and nanowire channel FETs are becoming more widely used, primarily because they may offer better performance than planar FETs at the same power budget.

FinFETs are three dimensional (3-D), fully depleted metal-oxide semiconductor field effect transistor (MOSFET) devices having a fin structure formed from the semiconductor substrate material. The fins may extend between the device source and drain surrounding the channel region forming the bulk of the semiconductor device. The gate structure may be located over the fins covering the channel region. Nanowire FETs, also referred to as gate-all-around (GAA) FETs, may include a source region, a drain region and nanowire channels between the source-drain regions. In this case, the gate may enfold the nanowire channels regulating electron flow through the nanowire channels between the source-drain regions. FinFETs and nanowire FETs architecture may allow for a more precise control of the conducting channel by the gate, significantly reducing the amount of current leakage when the device is in off state.

In the particular case of p-type FET devices, or p-FET devices, a silicon-germanium (SiGe) channel may help achieve the appropriate near band-edge workfuncion to enhance device performance.

SUMMARY

The ability to manufacture fully depleted CMOS FET devices including p-FET devices having a strained SiGe channel of unvarying dimensions may facilitate advancing the capabilities of current CMOS technology.

According to an embodiment of the present disclosure, a semiconductor structure may include: a p-FET device in a p-FET region of a semiconductor substrate including a silicon-germanium channel region with a homogenous distribution of germanium atoms and an n-FET device in an n-FET region of a semiconductor substrate including a silicon channel region. A dimension of the silicon-germanium channel region of the p-FET device may be substantially similar to a dimension of the silicon channel region of the n-FET device.

According to another embodiment of the present disclosure, a method of forming a semiconductor structure may include: forming a dummy gate above a semiconductor substrate. The dummy gate defines a source-drain region adjacent to the dummy gate and a channel region below the dummy gate. A silicon-germanium layer may be epitaxially grown above the source-drain region. The silicon-germanium layer may have a target concentration of germanium atoms. The semiconductor structure may be annealed to diffuse germanium atoms from the silicon-germanium layer into the channel region to form a silicon-germanium channel region.

According to another embodiment of the present disclosure, a method of forming a semiconductor structure may include: forming a dummy gate above a semiconductor substrate including an n-FET region and a p-FET region. The n-FET region of the semiconductor substrate may be masked. A silicon-germanium layer may be epitaxially grown above a portion of the semiconductor substrate in the p-FET region not covered by the dummy gate having a target concentration of germanium atoms. The semiconductor structure may be annealed to a temperature sufficient to cause germanium atoms from the silicon-germanium layer to diffuse into a portion of the substrate below the dummy gate to form a silicon-germanium channel region and a doped epitaxial layer may be formed adjacent to the silicon-germanium channel region to form a raised source-drain region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessary obscuring the presented embodiments.

In CMOS technology, p-FET devices may be formed simultaneously with n-FET devices in the same semiconductor substrate. Traditional methods of forming p-FET devices with strained silicon-germanium channel may alter the dimensions of the p-FET channel region. In an integrated circuit, p-FET and n-FET devices having channel regions of unvarying dimensions may provide appropriate control of short channel effect and enhance performance. Varying channel dimensions between p-FET and n-FET devices may affect the performance and reliability of fully depleted CMOS FET devices.

A method of forming a p-FET device having a strained silicon-germanium channel region of unvarying dimensions is described in detail below by referring to the accompanying drawings in FIGS. 1A through 6D, in accordance with an illustrative embodiment of the present disclosure. The method include forming a p-FET device having a silicon-germanium channel region that may suit p-FETs workfunction to enhance hole mobility and improve device performance without altering the dimensions of the p-FET channel region.

It may be understood that commonly a p-FET device may be formed simultaneously with an n-FET device in the same semiconductor substrate, and that both p-FET and n-FET devices may be used together in an integrated circuit. The p-FET and n-FET combination may find applications in analog or digital circuits. It should be noted that during the formation of the p-FET device, the n-FET device may be protected by a hardmask layer, owing to this reason the n-FET device will not be described below or shown in the accompanying figures. The steps involved in masking the n-FET device are conventional and well known to those skilled in the art. Also, it should be noted that while this description refers to some components of a p-FET device 100 in the singular tense, more than one component may be depicted throughout the figures and like components are labeled with like numerals.

Figure 8:
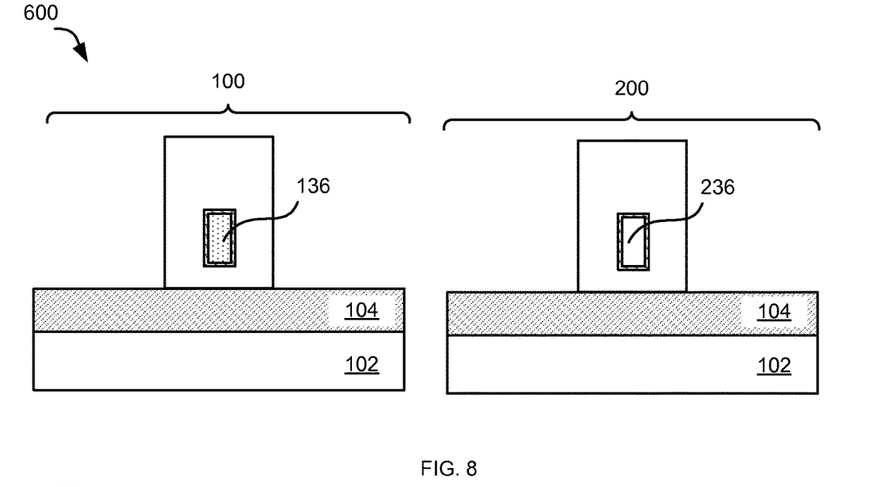
FIG. 8 is a cross section view of a nanowire FET semiconductor structure depicting a p-FET device and an n-FET device with channel regions of similar proportions, according to an embodiment of the present disclosure.
Figure 9:
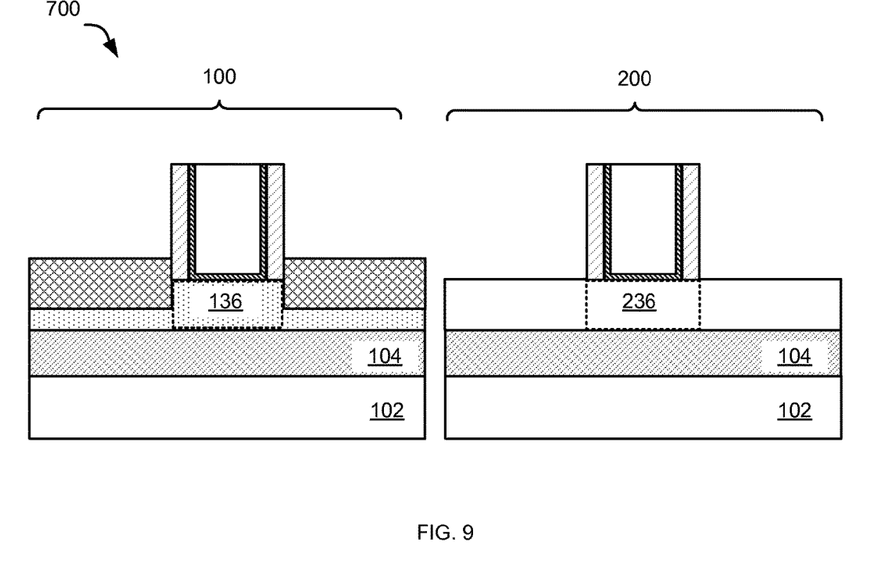
FIG. 9 is a cross section view of a planar ETSOI semiconductor structure depicting a p-FET device and an n-FET device with channel region of similar proportions, according to an embodiment of the present disclosure.

In describing the method of forming a p-FET device having a silicon-germanium channel region (hereinafter "SiGe channel region") with unvarying proportions, one possible embodiment will be discussed in detail below by referring to the accompanying drawings in FIGS. 1A-7. For illustration purposes only, without intent of limitation, in the figures and in the discussion one of the possible embodiments will be presented using a p-type FinFET device as example. Each of the embodiments may equally apply to a p-type planar extremely thin semiconductor-on-insulator (ETSOI) field effect transistor device or a p-type nanowire-based field effect transistor device as shown in FIGS. 8 and 9 respectively.

Figure 1A:
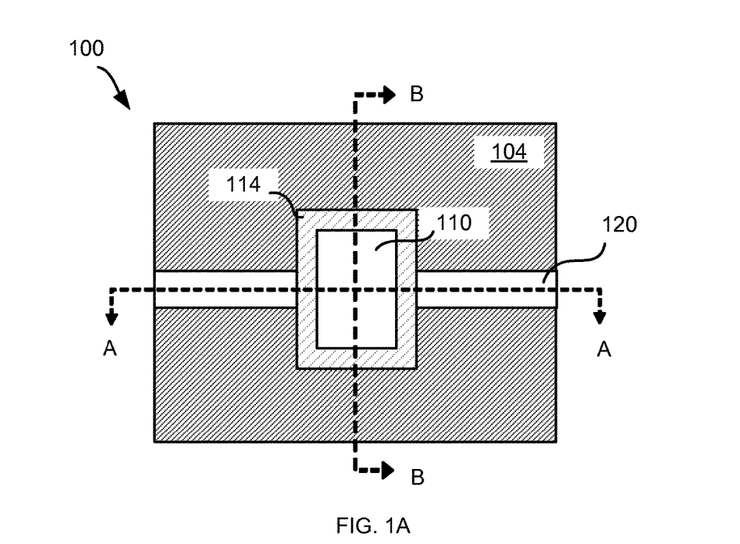
FIG. 1A is a top view of a p-FET device including a dummy gate, sidewall spacers and a fin formed on top of an SOI substrate, according to an embodiment of the present disclosure.
Figure 1B:
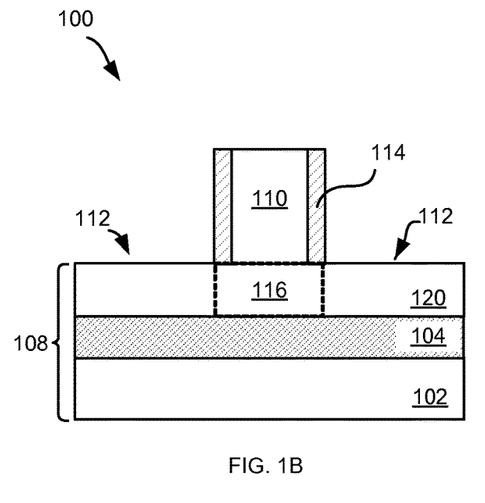
FIG. 1B is a cross section view of FIG. 1A taken along section line A-A, according to an embodiment of the present disclosure.
Figure 1C:
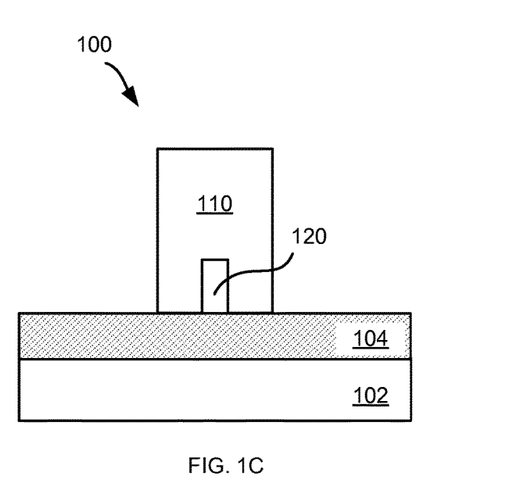
FIG. 1C is a cross section view of FIG. 1A taken along section line B-B, according to an embodiment of the present disclosure.

Referring to FIGS. 1A, 1B and 1C, several views of a p-FET device 100 are shown at an intermediate step during a replacement metal gate (RMG) process flow. At this step of the RMG process, the p-FET device 100 may include a dummy gate 110 formed over a semiconductor-on-insulator (SOI) substrate 108 (FIG. 1B). It should be noted that the dummy gate 110 may be formed in any semiconductor substrate known to a person having ordinary skill in the art, including but not limited to SOI substrates and bulk silicon substrates. In this embodiment, FIG. 1A illustrates the p-FET device 100 from a top view, FIG. 1B is a cross section view of FIG. 1A taken along section line A-A and FIG. 1C is a cross section view of FIG. 1A taken along section line B-B.

The SOI substrate 108 employed in the present embodiment may include a base substrate 102 (FIGS. 1B-1C), a buried dielectric layer 104 formed on top of the base substrate 102, and a SOI layer (not shown) formed on top of the buried dielectric layer 104. The buried dielectric layer 104 isolates the SOI layer from the base substrate 102. The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically, the base substrate 102 may be about, but is not limited to, several hundred microns thick. For example, the base substrate 102 may include a thickness ranging from 0.5 mm to about 1.5 mm.

The buried dielectric layer 104 may be formed from any of several known dielectric materials. Non-limiting examples include, for example, oxides, nitrides and oxynitrides of silicon. Oxides, nitrides and oxynitrides of other elements are also envisioned. In addition, the buried dielectric layer 104 may include crystalline or non-crystalline dielectric material. Moreover, the buried dielectric layer 104 may be formed using any of several known methods. Non-limiting examples include ion implantation methods, thermal or plasma oxidation or nitridation methods, chemical vapor deposition methods and physical vapor deposition methods. The buried dielectric layer 104 may include a thickness ranging from about 10 nm to about 500 nm. In one embodiment, the buried dielectric layer 104 may be about 145 nm thick.

The SOI layer (not shown) may include any of the several semiconductor materials included in the base substrate 102. In general, the base substrate 102 and the SOI layer may include either identical or different semiconductor materials with respect to chemical composition, dopant concentration and crystallographic orientation. In one embodiment of the present invention, the base substrate 102 and the SOI layer may include silicon. The SOI layer may include a thickness ranging from about 5 nm to about 100 nm that may be entirely consumed during patterning of fin 120 as described in detail below.

The SOI layer (not shown) and the base substrate 102 may have the same or different crystal orientation. For example, the crystal orientation of the base substrate 102 and/or the SOI layer (not shown) may be {100}, {110}, or {111}. Other crystallographic orientations besides those specifically mentioned may also be used in the present application. The base substrate 102 and/or the SOI layer (not shown) may be a single crystalline semiconductor material, a polycrystalline material, or an amorphous material. Typically, at least the SOI layer may be a single crystalline semiconductor material. In some embodiments, the SOI layer (not shown) may be processed to include semiconductor regions having different crystal orientations. Methods for forming the SOI layer are well known in the art. Non-limiting examples include SIMOX (Separation by Implantation of Oxygen), wafer bonding, and ELTRAN® (Epitaxial Layer TRANsfer). The SOI layer may include a thickness ranging from about 5 nm to about 100 nm that may be entirely consumed during patterning of fin 120 as described in detail below.

With continued reference to FIGS. 1A-1C, a fin 120 may be formed in the SOI substrate 108. The fin 120 may be etched from the SOI layer (not shown) of the SOI substrate 108 using typical photolithography techniques, such as for example, sidewall image transfer (SIT). The SOI layer may be entirely consumed during the process of forming the fin 120. In one embodiment, the fin 120 may include silicon (hereafter referred to as "silicon fin") and may have a height of about 4 nm to about 60 nm, and a width of about 2 nm to about 20 nm. It should be noted that any number of silicon fins applicable for a specific FinFET design may be manufactured.

Next, a dummy gate 110 may be formed over a portion of the silicon fin 120 using typical techniques known in the art. For example, the dummy gate 110 may be formed by depositing a blanket layer of polysilicon which may then be patterned to form the dummy gate 110. Sidewall spacers 114 may be formed by depositing or growing a conformal dielectric layer, followed by an anisotropic etch that removes the dielectric from the horizontal surfaces of the p-FET device 100, while leaving it on the sidewalls of the dummy gate 110. In one embodiment, the sidewall spacers 114 may include any suitable dielectric material such as silicon nitride. In one embodiment, the sidewall spacers 114 may have a horizontal width, or thickness, ranging from about 3 nm to about 20 nm. The sidewall spacers 114 may include a single layer of dielectric material; however, multiple layers of dielectric material may also be embodied. The sidewall spacers 114 may be positioned along sidewalls of the dummy gate 110 and separate a subsequently formed metal gate from a source-drain region 112.

Figure 2A:
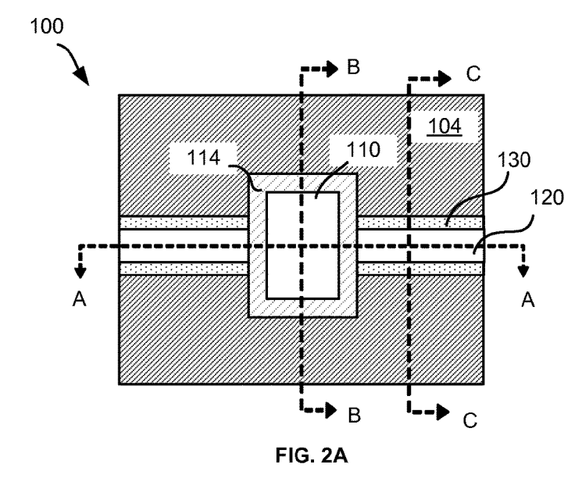
FIG. 2A is a top view of a p-FET device depicting the formation of a SiGe layer on top of an exposed surface of the fin, according to an embodiment of the present disclosure.
Figures 2B, 2C:
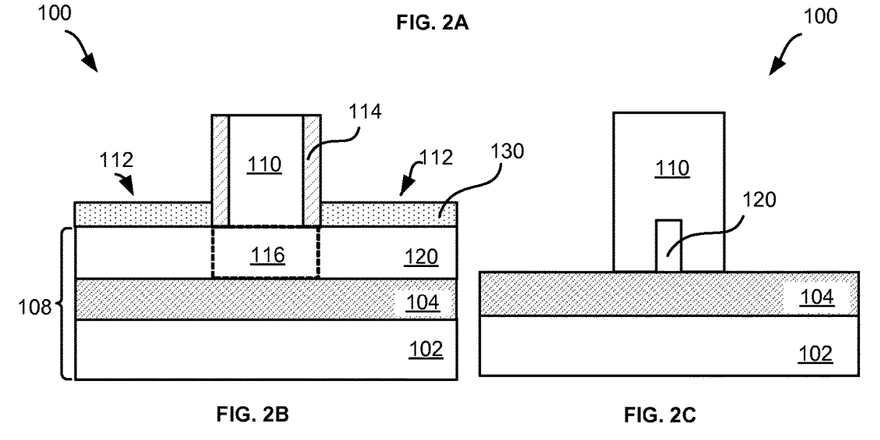
FIG. 2B is a cross section view of FIG. 2A taken along section line A-A, according to an embodiment of the present disclosure.
FIG. 2C is a cross section view of FIG. 2A taken along section line B-B, according to an embodiment of the present disclosure.
Figure 2D:
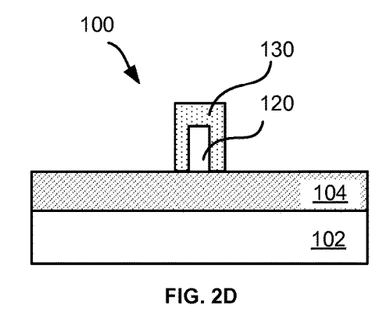
FIG. 2D is a cross section view of FIG. 2A taken along section line C-C, according to an embodiment of the present disclosure.

Referring now to FIGS. 2A-2D, a silicon-germanium layer 130 (hereinafter "SiGe layer") may be selectively formed on a portion of the silicon fin 120 not covered by the dummy gate 110. The portion of the silicon fin 120 not covered by the dummy gate 110 may define a source-drain region 112 for the p-FET device 100. The portion of the silicon fin 120 covered by the dummy gate 110 may define a channel region 116 in the silicon fin 120, such that the channel region 116 may be positioned below the dummy gate 110 and between the source-drain region 112. In this embodiment, FIG. 2A illustrates the p-FET device 100 from a top view, FIG. 2B is a cross section view of FIG. 2A taken along section line A-A, FIG. 2C is a cross section view of FIG. 2A taken along section line B-B and FIG. 2D is a cross section view of FIG. 2A taken along section line C-C.

In one embodiment, the SiGe layer 130 may be epitaxially grown off the top and sidewalls of the silicon fin 120. The SiGe layer 130 may be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it is formed. For example, an epitaxial semiconductor material deposited on a {100} crystal surface will take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Examples of various epitaxial growth process apparatuses that are suitable for use in forming the SiGe layer 130 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the SiGe layer 130 typically ranges from about 550° C. to about 900° C. Although higher temperature typically results in faster deposition, the faster deposition may result in crystal defects and film cracking. A number of different source gases may be used for the deposition of the SiGe layer 130. In one embodiment, a combination of a silicon source gas and a germanium source gas may be used in forming the layer of silicon germanium alloy. Examples of silicon source gases that may be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium source gases that may be used include germane, digermane, halogermane, dichlorogermane, trichlorogermane, tetrachlorogermane and combinations thereof. In some embodiments, a single source gas that includes a silicon component and a germanium component may be used in forming the SiGe layer 130. Carrier gases like hydrogen, nitrogen, helium, and argon may be used during the epitaxial growth process.

In one embodiment of the present disclosure, the SiGe layer 130 may include a silicon-germanium (SiGe) material, where the atomic concentration of germanium (Ge) may range from about 30% to about 80%. In another embodiment, the concentration of germanium (Ge) may range from about 40% to about 60%. The SiGe layer 130 may have a thickness ranging from about 5 nm to about 20 nm and ranges there between, although a thickness less than 5 nm and greater than 20 nm may be acceptable. In one particular embodiment, the SiGe layer 130 may have a thickness of about 10 nm.

The dummy gate 110 may protect the channel region 116 so that the SiGe layer 130 may not be grown on the channel region 116 as shown in FIG. 2C.

Figure 3A:
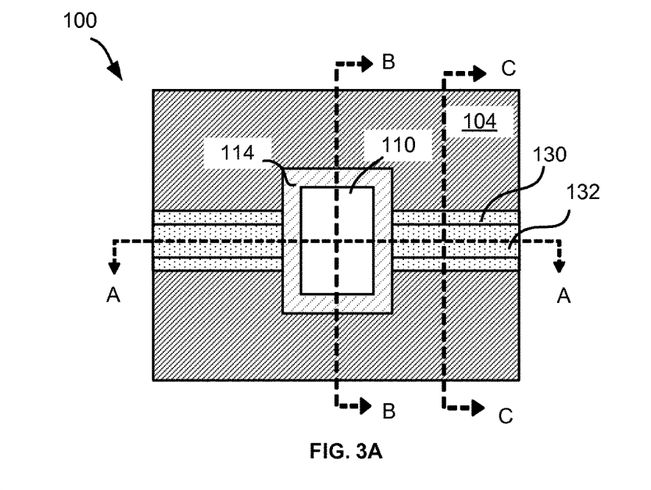
FIG. 3A is a top view of a p-FET device depicting a thermal treatment being conducted in the p-FET device to form a SiGe fin, according to an embodiment of the present disclosure.
Figure 3B:
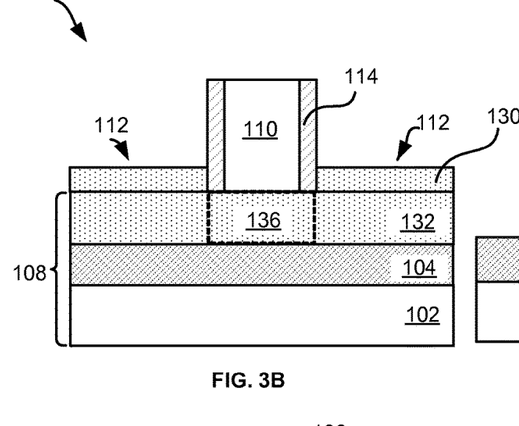
FIG. 3B is a cross section view of FIG. 3A taken along section line A-A, according to an embodiment of the present disclosure.
Figure 3C:
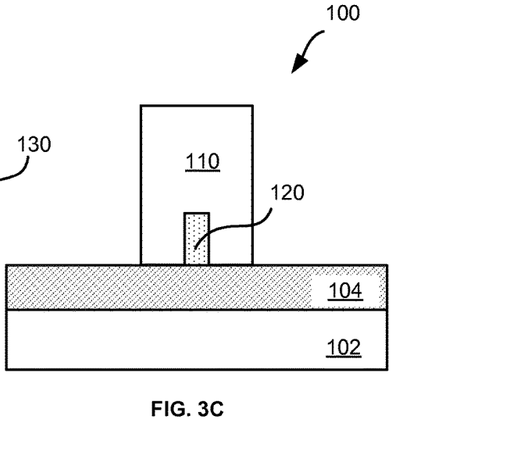
FIG. 3C is a cross section view of FIG. 3A taken along section line B-B, according to an embodiment of the present disclosure.
Figure 3D:
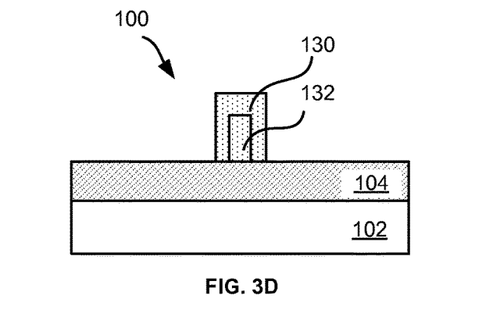
FIG. 3D is a cross section view of FIG. 3A taken along section line C-C, according to an embodiment of the present disclosure.

Referring now to FIGS. 3A-3D, the p-FET device 100 may be subjected to a thermal annealing treatment to cause diffusion of germanium atoms from the SiGe layer 130 into the silicon fin 120, and particularly into the channel region 116 to form a SiGe channel region 136. In this embodiment, FIG. 3A illustrates the p-FET device 100 from a top view, FIG. 3B is a cross section view of FIG. 3A taken along section line A-A, FIG. 3C is a cross section view of FIG. 3A taken along section line B-B and FIG. 3D is a cross section view of FIG. 3A taken along section line C-C.

The thermal treatment may be conducted by any method known in the art, for example, rapid thermal annealing (RTA) of the p-FET device 100. At this point of the manufacturing process, there may be no thermal budget constraint and a high temperature furnace anneal may be used to ensure a homogeneous distribution of germanium atoms in the silicon fin 120 (FIGS. 2A-2D). Stated differently, both the silicon fin 120 (FIGS. 2A-2D) and the SiGe layer 130 may have a homogenous distribution of germanium atoms after the p-FET device 100 undergoes the thermal annealing treatment.

The thermal diffusion process may be performed at a temperature high enough to cause diffusion of germanium atoms out of the SiGe layer 130 and into the silicon fin 120 (FIGS. 2A-2D). In an embodiment of the present disclosure, the annealing temperature may range from about 800° C. to about 1150° C. The inter-diffusion of silicon and germanium atoms between the SiGe layer 130 and the silicon fin 120 (FIGS. 2A-2D) may form a SiGe fin 132 and in turn the SiGe channel 136. Inter-diffusion may occur when germanium atoms, activated by the high annealing temperature, migrate from a region containing a high germanium concentration (such as the SiGe layer 130) to a region of low (or zero) concentration of germanium atoms (such as the silicon fin 120).

In general, the initial concentration of germanium atoms in the SiGe layer 130, the annealing temperature and time may determine the amount of germanium atoms diffusing into the silicon fin 120 (FIGS. 2A-2D) and particularly into the SiGe channel region 136 during the thermal treatment.

In an embodiment, the atomic concentration of germanium in the SiGe fin 132 and SiGe channel 136 after thermal diffusion may range from about 25% to about 45%. As previously discussed, the final concentration of germanium atoms in the SiGe fin 132 and the SiGe channel 136 may be proportional to the initial germanium concentration of the SiGe layer 130. At this step of the fabrication process, the atomic concentration of germanium in the SiGe layer 130 may have decreased after the thermal diffusion process, however it may still be high enough to allow for the selective etching of the SiGe layer 130 with respect to the SiGe fin 132. It should be noted that a thicker SiGe layer 130 may have a higher germanium concentration.

The dummy gate 110 may physically protect the channel region 116 (see FIGS. 2B and 2C) during the thermal diffusion process so that the physical dimensions of the SiGe channel 136 after the thermal diffusion process may remain the same as shown in FIG. 3C.

Figure 4A:
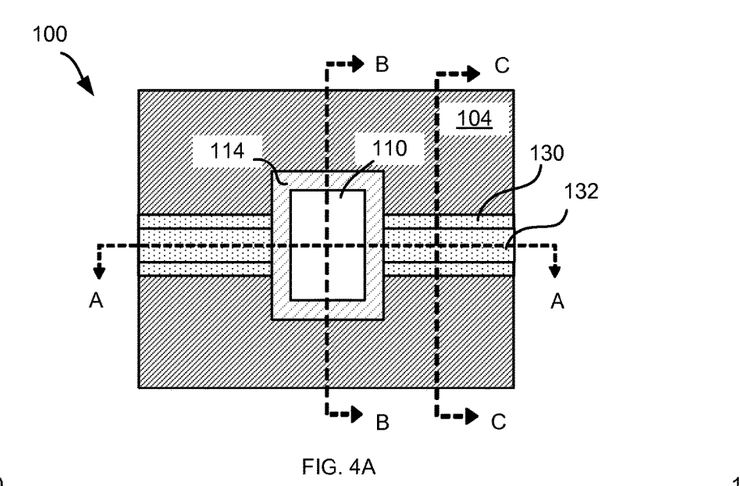
FIG. 4A is a top view of a p-FET device depicting the etching of the SiGe layer, according to an embodiment of the present disclosure.
Figure 4B:
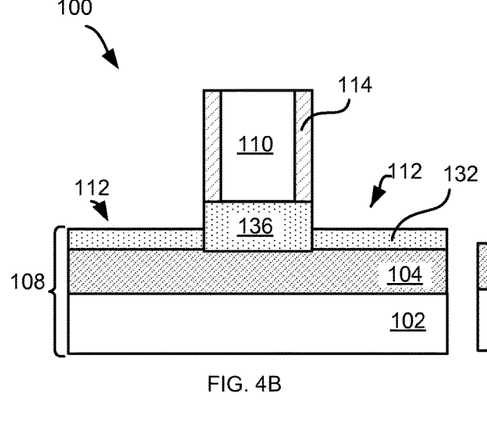
FIG. 4B is a cross section view of FIG. 4A taken along section line A-A, according to an embodiment of the present disclosure.
Figure 4C:
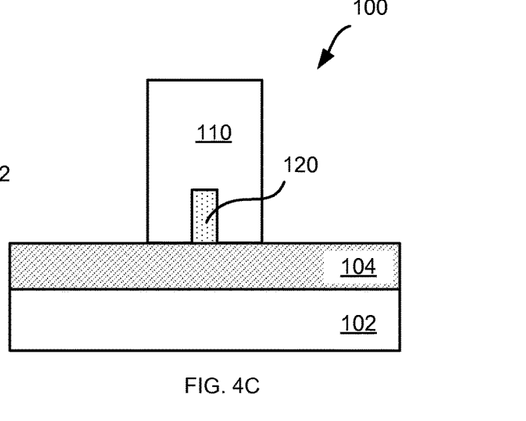
FIG. 4C is a cross section view of FIG. 4A taken along section line B-B, according to an embodiment of the present disclosure.
Figure 4D:
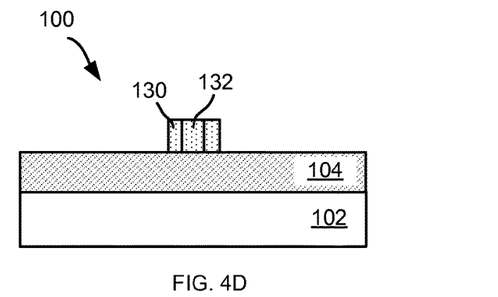
FIG. 4D is a cross section view of FIG. 4A taken along section line C-C, according to an embodiment of the present disclosure.

Referring now to FIGS. 4A-4D, the SiGe layer 130 may be etched by any suitable etching technique known in the art. The SiGe layer 130 may be entirely consumed during the etching process. The etching process may continue on the SiGe fin 132 until a thickness ranging from about 5 nm to about 20 nm may remain above the buried dielectric layer 104. In this embodiment, FIG. 4B is a cross section view of FIG. 4A taken along section line A-A, FIG. 4C is a cross section view of FIG. 4A taken along section line B-B and FIG. 4D is a cross section view of FIG. 4A taken along section line C-C. As illustrated in FIGS. 4B and 4D, etching of the SiGe layer 130 and of the SiGe fin 132 may not affect the dimensions of the SiGe channel 136.

Figure 5A:
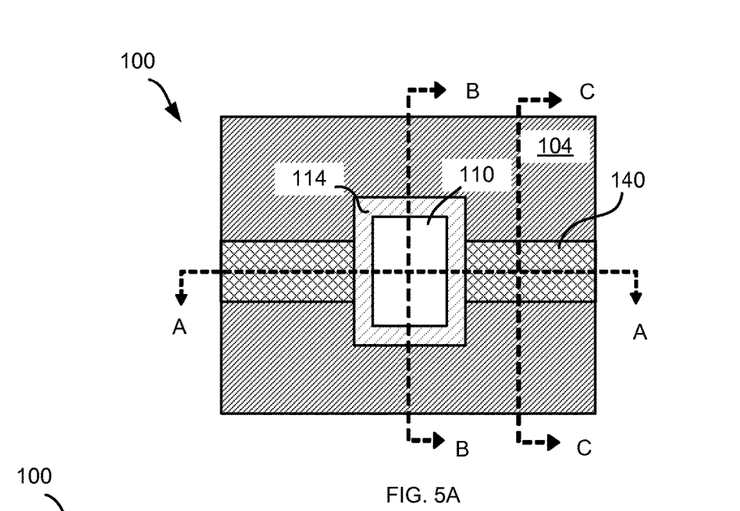
FIG. 5A is a top view of a p-FET device depicting the formation of a raised source-drain region, according to an embodiment of the present disclosure.
Figure 5B:
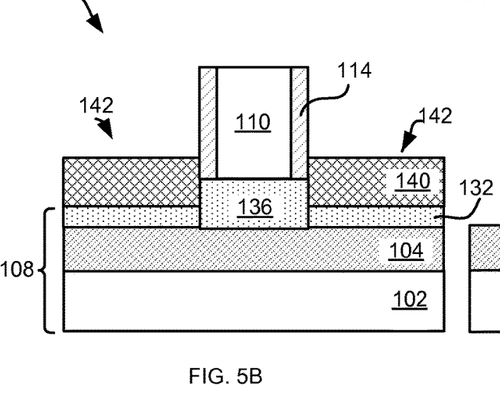
FIG. 5B is a cross section view of FIG. 5A taken along section line A-A, according to an embodiment of the present disclosure.
Figure 5C:
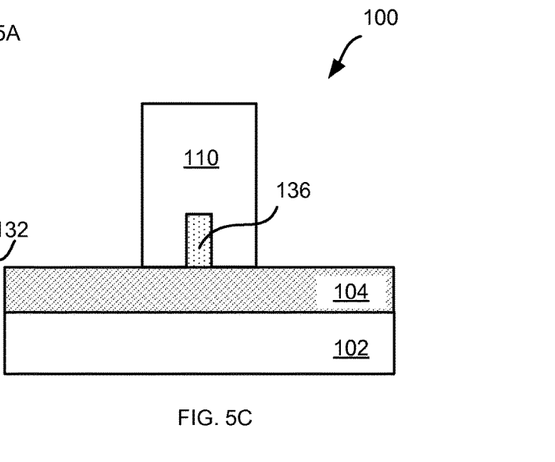
FIG. 5C is a cross section view of FIG. 5A taken along section line B-B, according to an embodiment of the present disclosure.
Figure 5D:
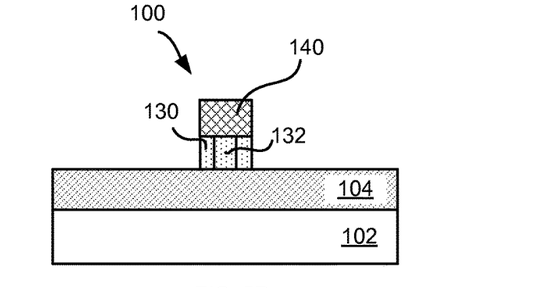
FIG. 5D is a cross section view of FIG. 5A taken along section line C-C, according to an embodiment of the present disclosure.

Referring now to FIGS. 5A-5D, a doped epitaxial layer 140 may be formed above the remaining portion of the SiGe fin 132 forming a raised source-drain (RSD) region 142. In this embodiment, FIG. 5B is a cross section view of FIG. 5A taken along section line A-A, FIG. 5C is a cross section view of FIG. 5A taken along section line B-B and FIG. 5D is a cross section view of FIG. 5A taken along section line C-C. As illustrated in FIGS. 5B and 5C, forming the raised source-drain region 142 may not affect the dimensions of the SiGe channel 136.

The doped epitaxial layer 140 may be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it is formed. For example, an epitaxial semiconductor material deposited on a {100} crystal surface will take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Examples of various epitaxial growth process apparatuses that are suitable for use in forming the doped epitaxial layer 140 may include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the doped epitaxial layer 140 typically ranges from about 550° C. to about 900° C. Although higher temperature typically results in faster deposition, the faster deposition may result in crystal defects and film cracking.

A number of different source gases may be used for the deposition of the doped epitaxial layer 140. In one embodiment, a combination of a silicon source gas and a germanium source gas may be used in forming the layer of silicon germanium alloy. Examples of silicon source gases that may be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that may be used include germane, digermane, halogermane, dichlorogermane, trichlorogermane, tetrachlorogermane and combinations thereof. In some embodiments, a single source gas that includes a silicon component and a germanium component may be used in forming the doped epitaxial layer 140. Carrier gases like hydrogen, nitrogen, helium and argon may be used during the epitaxial growth process.

In one embodiment, the doped epitaxial layer 140 forming the raised source-drain region 142 may include growing a p-type doped material such as boron-doped silicon-germanium (SiGe) on the remaining portion of the SiGe fin 132, where the atomic concentration of germanium (Ge) may range from about 10% to about 80%. In another embodiment, the concentration of germanium (Ge) may range from about 25 to about 50%. The p-type dopant may include any known dopant use in the fabrication of a p-FET device, such as, for example, boron. In one embodiment, the dopant concentration of boron may range from about $1 \times 10^{19}$ cm$^{-3}$ to about $1.5 \times 10^{21}$ cm$^{-3}$, and more preferably the dopant concentration may be about $4 \times 10^{20}$ cm$^3$. The doped epitaxial layer 140 may have a thickness ranging from about 5 nm to about 20 nm and ranges there between, although a thickness less than 5 nm or greater than 20 nm may be acceptable.

The raised source-drain region 142 may provide low parasitic resistance and apply a stress on the SiGe channel region 136 for improved carrier mobility. The doped epitaxial layer 140 forming the raised source-drain region 142 in the p-FET device 100 may have a larger lattice constant relative to the lattice constant of the SOI substrate 108 transferring a lattice strain from the raised source-drain region 142 to the SOI substrate 108. The difference in lattice constant may apply a compressive strain on the SiGe channel 136 which may enhance hole mobility.

Figure 6A:
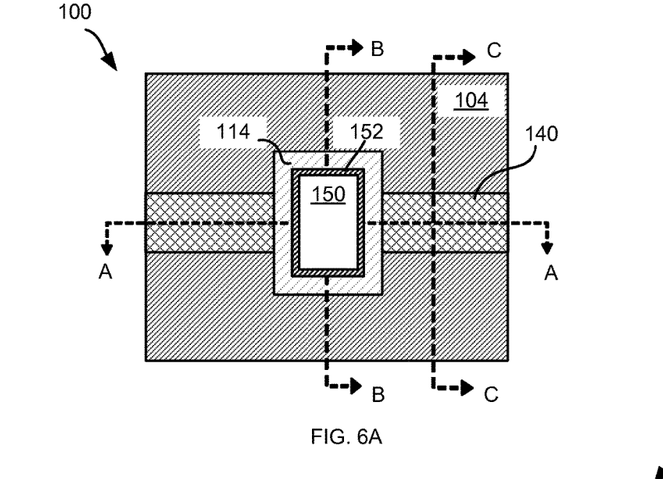
FIG. 6A is a top view of a p-FET device depicting the formation of a metal gate, according to an embodiment of the present disclosure.
Figure 6B:
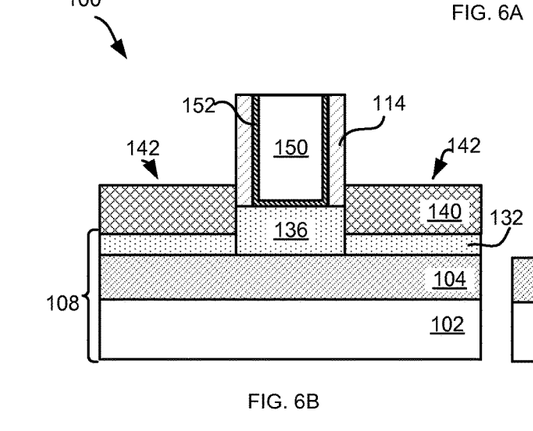
FIG. 6B is a cross section view of FIG. 6A taken along section line A-A, according to an embodiment of the present disclosure.
Figure 6C:
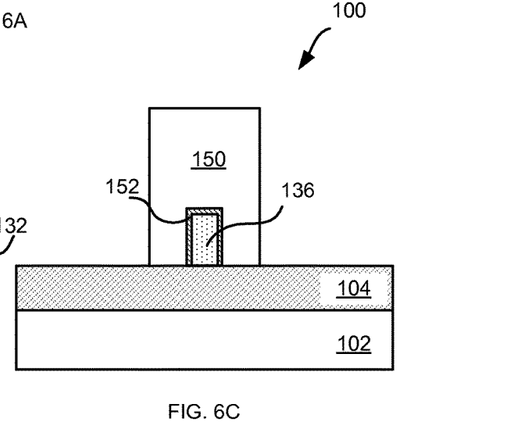
FIG. 6C is a cross section view of FIG. 6A taken along section line B-B, according to an embodiment of the present disclosure.
Figure 6D:
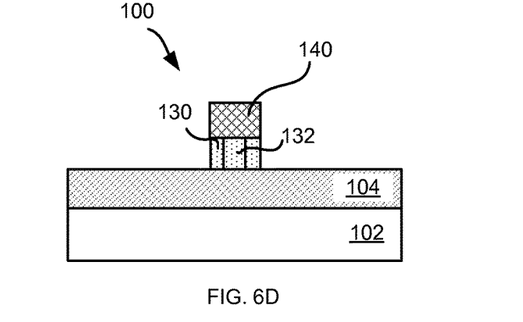
FIG. 6D is a cross section view of FIG. 6A taken along section line C-C, according to an embodiment of the present disclosure.

Referring now to FIGS. 6A-6D, the RMG process may continue with the removal of the dummy gate 110 (FIGS. 5A, 5C and 5D) and the formation of a functional gate or metal gate 150. In this embodiment, FIG. 6B is a cross section view of FIG. 6A taken along section line A-A, FIG. 6C is a cross section view of FIG. 6A taken along section line B-B and FIG. 6D is a cross section view of FIG. 6A taken along section line C-C.

The dummy gate 110 (shown in FIGS. 5A, 5C and 5D) may be removed from between the pair of sidewall spacers 114, as by, for example, an anisotropic vertical etch process, such as, a reactive ion etch (RIE). This creates an opening (not shown) between the pair of sidewall spacers 114 where the metal gate 150 may then be formed between the pair of sidewall spacers 114. The metal gate 150 may include any suitable high-k metal that may provide the desired workfunction to the p-FET device 100. In one embodiment of the present disclosure, the metal gate 150 may include: titanium nitride (TiN), tungsten nitride (WN), tantalum nitride (TaN) or other suitable materials. The metal gate 150 may be formed by any deposition process known in the art including, but not limited to CVD, PECVD, HDCVD, PVD, plating, sputtering, evaporation, and chemical solution deposition. Optionally, a gate dielectric 152 may be configured below the metal gate 150 to separate the metal gate 150 from the SiGe fins 132 and more specifically to separate the metal gate 150 from the SiGe channel region 136. In one embodiment, the gate dielectric 152 may include a high-k dielectric material having a dielectric constant greater than, for example, 3.9, which is the dielectric constant of silicon oxide. The gate dielectric 152 may be required to fulfill the scalability and current-leakage prevention needs of p-FET device 100.

After formation of the metal gate 150, the manufacturing process may continue following typical steps in CMOS FET fabrication technology. At this step of the fabrication process, the hardmask layer blocking the n-FET device region (not shown) may be removed by any suitable removal technique known in the art.

Figure 7:
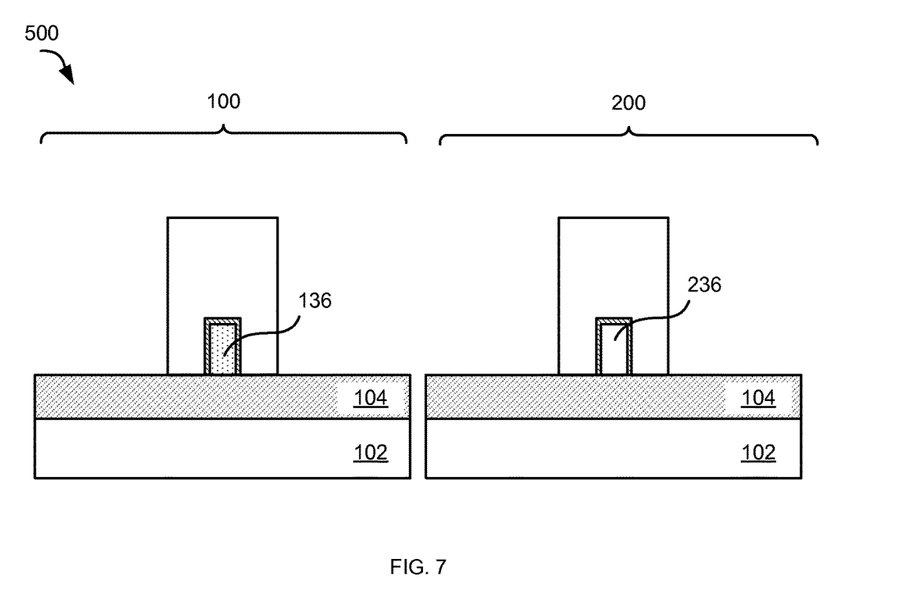
FIG. 7 is a cross section view of a FinFET semiconductor structure depicting a p-FET device and an n-FET device with channel regions of similar proportions, according to an embodiment of the present disclosure.

Referring now to FIG. 7, a cross section view of a semiconductor structure 500 including the p-FET device 100 and an n-FET device 200 is shown. In one embodiment, the p-FET device 100 and the n-FET device 200 may be formed in the same semiconductor substrate separated by isolation regions (not shown). According to an embodiment of the present disclosure, the physical dimensions of the SiGe channel 136 of the p-FET device 100 may be substantially similar to the dimensions of a silicon channel 236 of the n-FET device 200. Substantially similar dimensions may include uniform width and height between the fins forming the p-FET and n-FET channel regions 136 and 236 respectively. This in turn may provide a semiconductor structure 500 having enhanced short-channel effect control and improved performance.

Referring now to FIG. 8, a cross section view of an alternate semiconductor structure 600 having a p-FET device 100 and an n-FET device 200 is shown. According to an alternate embodiment of the present disclosure, the p-FET device 100 may include a p-type nanowire FET device and the n-FET device 200 may include an n-type nanowire FET device. At this point of the manufacturing process, the steps associated with the formation of a SiGe channel in the p-FET device 100 described in FIGS. 1A-7 are completed. The p-FET device 100 including the SiGe channel 136 may be formed following the steps described above in FIGS. 1A-7. It may be understood by a person having ordinary skills in the art that numerical values such as, for example, germanium concentration and dopant concentration previously described may be applied to this alternate embodiment of the present disclosure. It may also be understood by a person having ordinary skills in the art that some differences in the processing steps may vary according to the embodiment. For example, in the p-FET device 100 of the semiconductor structure 500, nanowire structures may not be recessed to form a raised source-drain region (e.g. raised source-drain region 142).

The diameter of the SiGe channel 136 of the p-FET device 100 may be substantially similar to the diameter of a silicon channel 236 of the n-FET device 200. The semiconductor structure 500 may include the same advantages described above in reference to FIGS. 1A-7 for FinFET devices, namely improved hole mobility in the p-FET device 100 and effective short-channel effect control due to unvarying channel dimensions among p-FET and n-FET devices.

Referring now to FIG. 9, a cross section view of another alternate semiconductor structure 700 having a p-FET device 100 and an n-FET device 200 is shown. According to another alternate embodiment of the present disclosure, the p-FET device 100 may include a p-type planar ETSOI FET device and the n-FET device 200 may include an n-type planar ETSOI FET device. At this point of the manufacturing process, the steps associated with the formation of a SiGe channel in the p-FET device 100 described in FIGS. 1A-7 are completed. The p-FET device 100 including the SiGe channel 136 may be formed following the steps described above in FIGS. 1A-7. It may be understood by a person having ordinary skills in the art that numerical values such as, for example, germanium concentration and dopant concentration previously described may be applied to this alternate embodiment of the present disclosure. It may also be understood by a person having ordinary skills in the art that some differences in the processing steps may vary according to the embodiment.

The dimensions of the SiGe channel 136 of the p-FET device 100 may be substantially similar to the dimensions of a silicon channel 236 of the n-FET device 200. The semiconductor structure 700 may include the same advantages described above in reference to FIGS. 1A-7 for FinFET devices, namely improved hole mobility in the p-FET device 100 and effective short-channel effect control due to unvarying channel dimensions among p-FET and n-FET devices.

The steps described above may provide a method of forming a p-FET device namely planar ETSOI, FinFET or nanowire FET having a strained silicon-germanium (SiGe) channel region of unvarying proportions. The SiGe channel region may suit p-FETs workfunction enhancing hole mobility and improving device performance without altering the dimensions of the conducting channel region. In consequence, p-FET devices may have SiGe channel regions with substantially similar proportions to silicon channel regions of n-FET devices within the same chip structure, which may be crucial to effectively control short-channel effect in CMOS FET devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
 a p-FET device in a p-FET region of a semiconductor substrate, the p-FET device comprising:
  a metal gate perpendicular to and above the semiconductor substrate, a portion of the semiconductor substrate below the metal gate defines a channel region, a recessed portion of the semiconductor substrate not covered by the metal gate defines a source-drain region,
  wherein the semiconductor substrate comprises a nanowire of a nanowire FET, and the metal gate surrounds the nanowire,
  wherein a top surface of the channel region is above a top surface of the source-drain region and the source-drain region is in direct contact with a portion of a sidewall of the channel region,
  wherein the channel region and the source-drain region comprise silicon-germanium with a homogenous distribution of germanium atoms; and
  a p-doped epitaxial layer above and in direct contact with the source-drain region and in direct contact with a portion of the sidewall of the channel region, the p-doped epitaxial layer comprising epitaxially grown boron-doped silicon-germanium or boron-doped silicon, wherein the p-doped epitaxial layer and the source-drain region define a raised source-drain region; and
 an n-FET device in an n-FET region of the semiconductor substrate, the n-FET device including a silicon only channel region, wherein dimensions of the channel region of the p-FET device are substantially the same as dimensions of the silicon channel region of the n-FET device.

2. The structure of claim 1, wherein the channel region has substantially unvarying dimensions.

3. The structure of claim 1, wherein a concentration of germanium atoms in the channel region and a concentration of germanium atoms in the source-drain region ranges from approximately 25% to approximately 45%.

4. The structure of claim 1, further comprising:
 a gate dielectric layer separating the metal gate from the channel region.

5. The structure of claim 1, further comprising:
 a pair of sidewall spacers disposed on opposite sidewalls of the metal gate, the pair of sidewall spacers being separated from the metal gate by a gate dielectric layer, and a combined width of the pair of sidewall spacers, the gate dielectric layer, and the metal gate is equal to a length of the channel region.

6. The structure of claim 1, wherein a width of the metal gate is less than a length of the channel region.

7. The structure of claim 1, wherein the metal gate comprises titanium nitride (TiN), tungsten nitride (WN), tantalum nitride (TaN) or some combination thereof.

8. The structure of claim 1, wherein the nanowire portion of the substrate is above and does not contact a buried oxide layer of the semiconductor substrate.

9. A semiconductor structure comprising:
a p-FET device in a p-FET region of a semiconductor substrate, the p-FET device comprising:
   a metal gate perpendicular to and above the semiconductor substrate, a portion of the semiconductor substrate below the metal gate defines a channel region, a recessed portion of the semiconductor substrate not covered by the metal gate defines a source-drain region,
   wherein the semiconductor substrate comprises a fin, and the metal gate is around the fin,
   wherein a top surface of the channel region is above a top surface of the source-drain region and the source-drain region is in direct contact with a portion of a sidewall of the channel region,
   wherein the channel region and the source-drain region comprise silicon-germanium with a homogenous distribution of germanium atoms; and
   a p-doped epitaxial layer above and in direct contact with the source-drain region and in direct contact with a portion of the sidewall of the channel region, the p-doped epitaxial layer comprising epitaxially grown boron-doped silicon-germanium or boron-doped silicon, wherein the p-doped epitaxial layer and the source-drain region define a raised source-drain region; and
an n-FET device in an n-FET region of the semiconductor substrate, the n-FET device including a silicon only channel region, wherein dimensions of the channel region of the p-FET device are substantially the same as dimensions of the silicon channel region of the n-FET device.

10. The structure of claim 9, wherein the channel region has substantially unvarying dimensions.

11. The structure of claim 9, wherein a concentration of germanium atoms in the channel region and a concentration of germanium atoms in the source-drain region ranges from approximately 25% to approximately 45%.

12. The structure of claim 9, further comprising:
   a gate dielectric layer separating the metal gate from the channel region.

13. The structure of claim 9, further comprising:
   a pair of sidewall spacers disposed on opposite sidewalls of the metal gate, the pair of sidewall spacers being separated from the metal gate by a gate dielectric layer, and a combined width of the pair of sidewall spacers, the gate dielectric layer, and the metal gate is equal to a length of the channel region.

14. The structure of claim 9, wherein a width of the metal gate is less than a length of the channel region.

15. The structure of claim 9, wherein the metal gate comprises titanium nitride (TiN), tungsten nitride (WN), tantalum nitride (TaN) or some combination thereof.

16. The structure of claim 9, wherein the nanowire portion of the substrate is above and does not contact a buried oxide layer of the semiconductor substrate.

* * * * *